(12) United States Patent
Draxelmayr

(10) Patent No.: US 8,004,350 B2
(45) Date of Patent: Aug. 23, 2011

(54) IMPEDANCE TRANSFORMATION WITH TRANSISTOR CIRCUITS

(75) Inventor: Dieter Draxelmayr, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/477,569

(22) Filed: Jun. 3, 2009

(65) Prior Publication Data

US 2010/0308906 A1   Dec. 9, 2010

(51) Int. Cl.
*G05F 3/24* (2006.01)
*G05F 3/26* (2006.01)

(52) U.S. Cl. .................................. 327/543; 323/315

(58) Field of Classification Search .................. None
See application file for complete search history.

(56) References Cited

U.S. PATENT DOCUMENTS

| | | | | |
|---|---|---|---|---|
| 5,801,523 A | * | 9/1998 | Bynum | 323/315 |
| 5,864,228 A | * | 1/1999 | Brown et al. | 323/315 |
| 6,172,556 B1 | * | 1/2001 | Prentice | 327/543 |
| 7,009,452 B2 | * | 3/2006 | Grilo | 330/288 |
| 7,218,170 B1 | * | 5/2007 | Carter et al. | 327/552 |
| 7,711,342 B2 | * | 5/2010 | Steckler et al. | 455/296 |
| 2010/0029228 A1 | * | 2/2010 | Holden et al. | 455/127.1 |

* cited by examiner

*Primary Examiner* — Lincoln Donovan
*Assistant Examiner* — Terry L Englund
(74) *Attorney, Agent, or Firm* — SpryIP, LLC

(57) ABSTRACT

An impedance transformation circuit utilizes two transistor circuits.

9 Claims, 8 Drawing Sheets

IMPEDANCE TRANSFORMATION WITH TRANSISTOR CIRCUITS

BACKGROUND

In some instances, an amplifier device can require very high input impedance. For example, a capacitive sensor feeding the amplifier device may require an impedance in the giga-ohm range. Simply inserting a very large resistor between an input of the amplifier device and a bias point to generate an appropriate operating point consumes too much silicon area to be practical.

Impedance transformations may be used to increase input impedance of the amplifier circuit. One impedance transformation technique relates to coupling a pair of transistor circuits in a current mirror arrangement with each transistor circuit of the pair having a different channel width to channel length (W/L) ratio. In some implementations, the transistor circuit having a lower W/L ratio acts as an impedance device. In these implementations, the quotient in the W/L ratios of the transistor circuits is proportional to the impedance transformation. To illustrate, when the W/L ratio of a first transistor circuit is approximately ten times larger than the W/L ratio of a second transistor circuit, the impedance value of the second transistor circuit increases by a factor of ten. However, circuit arrangements relying on differing W/L ratios in a pair of transistor circuits for impedance transformation are only easily achievable for impedances in the mega-ohm range. In order to produce impedances in the giga-ohm range for these circuit arrangements, currents on the order of picoamps may be required, making the impedance given by these circuit arrangements impractical.

BRIEF DESCRIPTION OF THE DRAWINGS

The detailed description is described with reference to the accompanying figures. In the figures, the left-most digit(s) of a reference number identifies the figure in which the reference number first appears. The use of the same reference number in different instances in the description and the figures may indicate similar or identical items.

DETAILED DESCRIPTION

This disclosure describes using impedance transformations to provide a high impedance circuit at an input of an amplifier circuit using a relatively small amount of silicon area. In addition, the high impedance circuit utilizing the impedance transformations provides good control over the impedance value. The impedance transformations may be produced with negative channel metal oxide semiconductor (NMOS) transistor circuits and positive channel metal oxide semiconductor (PMOS) transistor circuits. Impedance transformation may take place due to differences in the channel width to channel length ratios of transistor circuit pairs.

Additionally, impedance transformation may take place due to differences in overdrive voltages of transistor circuit pairs. An overdrive voltage is defined by a gate-source voltage of a transistor circuit minus a threshold voltage of the transistor circuit. A transistor circuit having an overdrive voltage lower than the overdrive voltage of another transistor circuit may serve as an impedance device. In some implementations, at least the transistor circuit with the lower overdrive voltage is operating with a gate-source voltage in the sub-threshold region. A transistor circuit is operating with a gate-source voltage in the sub-threshold region when the gate-source voltage is less than the voltage that turns on the transistor circuit (i.e. when the overdrive voltage is a negative value). When the gate-source voltage of the transistor circuit serving as the impedance device is in the sub-threshold region, the impedance increases exponentially in relation to the difference between the overdrive voltages of a pair of transistors. For example, when the overdrive voltage of the impedance device transistor is a specified amount lower than the overdrive voltage of another transistor circuit, the impedance of the impedance device transistor may increase by a factor of ten. In one illustration, the impedance of the impedance device transistor may increase by a factor of ten for every 80-90 mV difference between the overdrive voltages of the transistor circuits. In some implementations, the differences in the overdrive voltages may be produced via the gates of the transistor circuits. In other implementations, the differences in the overdrive voltages may be produced via the sources of the transistor circuits.

Figure 1:
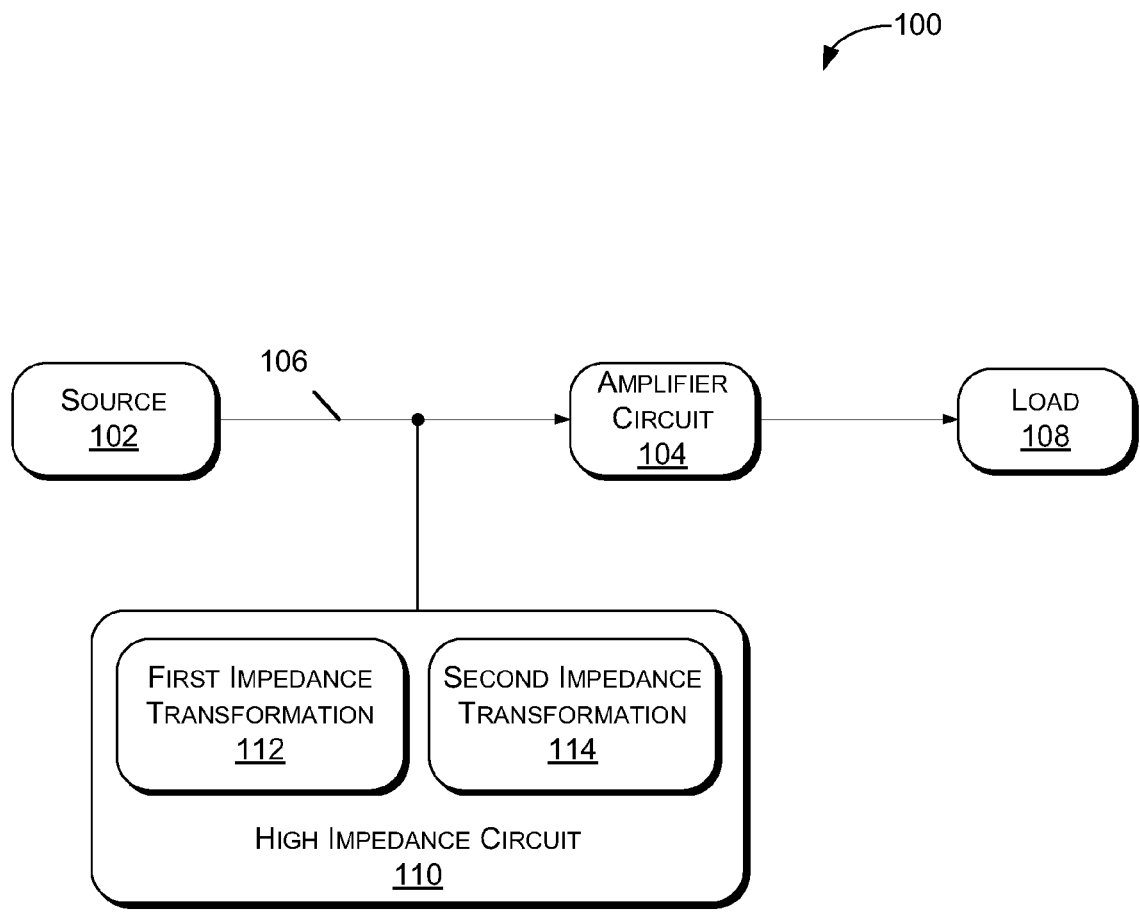
FIG. 1 is a schematic diagram of a system including a high impedance circuit coupled between a source and an amplifier circuit.

FIG. 1 is a schematic diagram of a system 100 to provide high impedance at an input of an amplifier circuit. A source 102 and an amplifier circuit 104 are connected by a source-amplifier line 106. The source 102 may include one or more circuit arrangements that provide input signals to the amplifier circuit 104. The input signals may include radio frequency signals, audio signals, digital signals, other signals carrying data, or a combination thereof. In some implementations, the source 102 may be a capacitive voltage source. For example, the source 102 may be a silicon microphone.

The amplifier circuit 104 may include one or more circuit arrangements to amplify the signals received from the source 102 and provide them to a load 108. In some instances, the amplifier circuit 104 may require very high input impedance. For example, the amplifier circuit 104 may require very high input impedance when amplifying a signal from a small capacitive sensor having a capacitance of a few picofarads and having low corner frequencies, such as a silicon microphone. The load 108 may include an output device, such as an audio speaker, an analog to digital conversion circuit, a mixer, or a combination thereof.

The system 100 also includes a high impedance circuit 110 to provide a well-defined DC voltage at a very high impedance level. The high impedance circuit 110 may utilize impedance transformations to provide the high impedance input to the amplifier circuit 104. The high impedance circuit 110 produces a first impedance transformation 112. The first impedance transformation 112 may be produced by one or more transistor circuit pairs having different channel width to channel length (W/L) ratios. For example, the first impedance transformation 112 may be produced by a first transistor circuit having a first W/L ratio coupled to a second transistor circuit having a second W/L ratio that is less than the first W/L ratio. In this example, the second transistor circuit serves as an impedance device with an impedance transformation proportional to the quotient of the first W/L ratio and the second W/L ratio. The W/L ratio of a transistor circuit may be realized by a single transistor. Alternatively, the W/L ratio of a transistor circuit may be realized by connecting a number of transistors in parallel or by connecting a number of transistors in series. The first impedance transformation 112 may be produced by a number of pairs of transistor circuits coupled to each other, where the transistor circuits of each respective pair have differing W/L ratios. The transistor circuits may include NMOS transistors and/or PMOS transistors.

The high impedance circuit 110 may also produce a second impedance transformation 114. The second impedance transformation 114 may be produced by providing different overdrive voltages to each of a pair of transistor circuits coupled to each other. Different overdrive voltages may be produced when the difference between a gate-source voltage and a threshold voltage of a first transistor circuit is offset from the difference between a gate-source voltage and a threshold voltage of a second transistor circuit. In one example, a first transistor circuit and a second transistor circuit may have similar threshold voltages. In this example, the first transistor circuit may have a first gate-source voltage and the second transistor circuit may have a second gate-source voltage that is smaller than the first gate-source voltage. In this way, the first transistor circuit and the second transistor circuit have differing overdrive voltages. In another example, the first transistor circuit and the second transistor circuit may have similar gate-source voltages, but the first transistor circuit may have a first threshold voltage and the second transistor circuit may a second threshold voltage that is smaller than the first threshold voltage. Consequently, the first transistor circuit and the second transistor circuit have different overdrive voltages.

The difference between the overdrive voltages of the first transistor circuit and the second transistor circuit may be produced by placing the first transistor circuit and the second transistor circuit in various arrangements, such that the overdrive voltage of the transistor circuit serving as the impedance device is produced by offsetting the overdrive voltage of the other transistor circuit by a particular amount. In particular illustrative implementations, the first transistor circuit and the second transistor circuit are arranged in a current mirror type arrangement. In other implementations, the difference between the overdrive voltages of the first transistor circuit and the second transistor circuit is produced by modifying the gate-source voltage of the first transistor circuit via an impedance device, such as a resistor, feeding the modified gate-source voltage into a number of operational amplifiers, and providing the output voltage of the operational amplifier arrangement to the second transistor circuit.

In some implementations, the gate-source voltages of the first and second transistor circuits may be provided by a voltage source coupled to the first transistor circuit and coupled to the second transistor circuit. Additionally, the respective gate-source voltages may be in the sub-threshold region of the transistor circuits. The gate-source voltages may be produced through the gates of the transistor circuits, the sources of the transistor circuits, or a combination thereof. The second impedance transformation 114 may be produced using a number of pairs of transistor circuits, with the transistor circuits of each respective pair having different overdrive voltages. The pairs of transistor circuits may include NMOS transistors, PMOS transistors, or a combination thereof.

By producing the first impedance transformation 112 in conjunction with the second impedance transformation 114, the high impedance circuit 110 may provide very high impedance with respect to the input of the amplifier circuit 104. Thus, the high impedance circuit 110 may provide high input impedance to the amplifier circuit 104, while minimizing the silicon area used to achieve the high input impedance. In addition, the currents provided to the high impedance circuit 110 to produce the very high input impedance of the amplifier circuit 104 are large enough for the impedance produced by the high impedance circuit 110 to be accurate.

Figure 2:
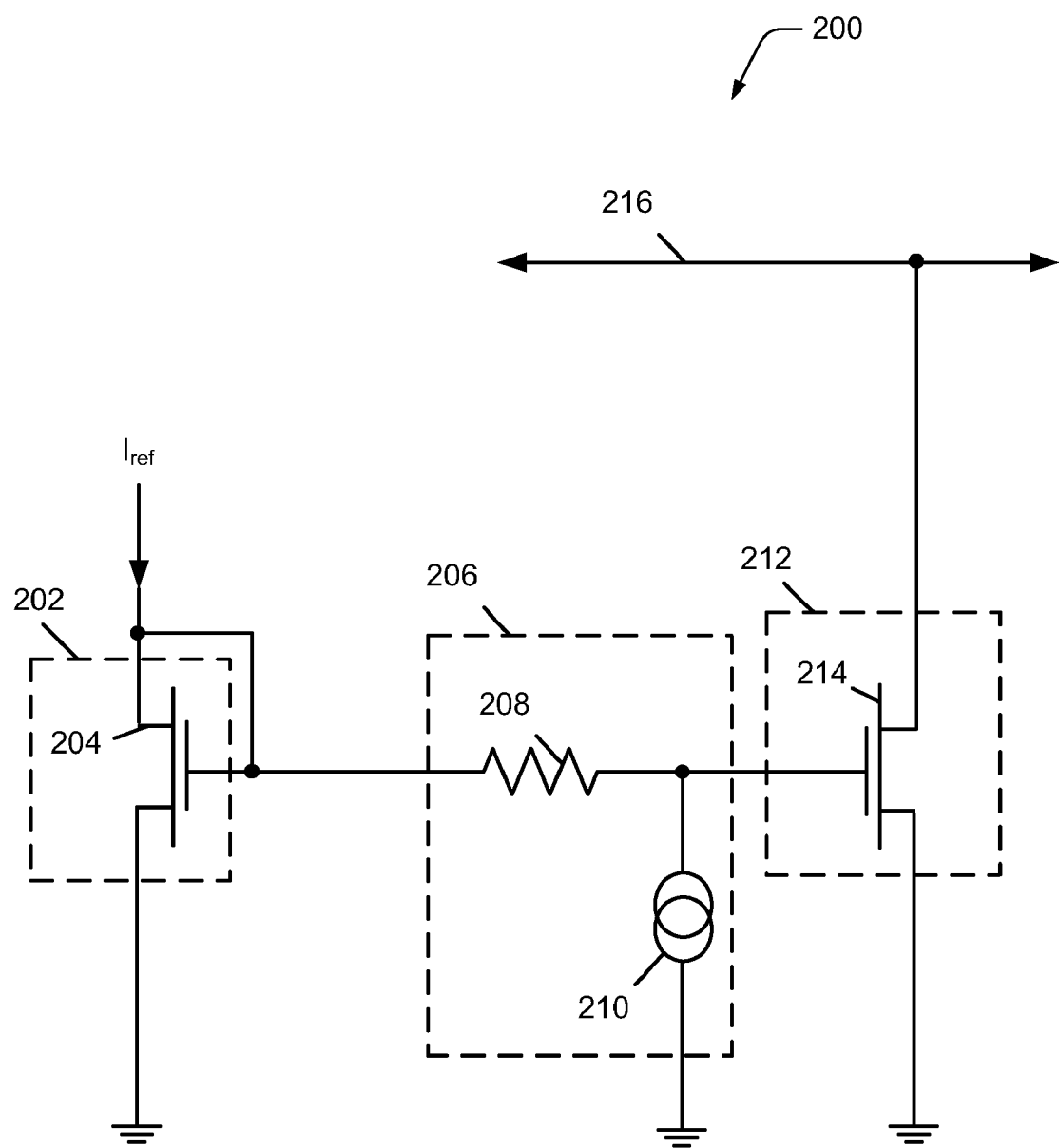
FIG. 2 is a schematic diagram of a high impedance circuit including negative channel metal oxide semiconductor (NMOS) transistor circuits coupled to a voltage source providing different overdrive voltages to each transistor circuit.

FIG. 2 is a schematic diagram of a high impedance circuit 200 including negative channel metal oxide semiconductor (NMOS) transistor circuits coupled to a voltage source providing different overdrive voltages to each transistor circuit. The high impedance circuit 200 includes a first transistor circuit 202. The first transistor circuit 202 may have a first channel width to channel length (W/L) ratio. In addition, the first transistor circuit 202 includes one or more NMOS transistors represented by a first NMOS transistor 204. Thus, the W/L ratio of the first transistor circuit 202 may be realized in a single NMOS transistor or in a number of NMOS transistors. In some instances, the W/L ratio may be realized by a number of NMOS transistors connected in parallel. A gate of the first NMOS transistor 204 is coupled to a voltage source 206 and a source of the first NMOS transistor 204 is coupled to ground. A drain of the first NMOS transistor 204 receives a reference current, $I_{REF}$.

The voltage source 206 includes a number of components, such as an impedance element 208 and a current source 210. The impedance element 208 may include one or more resistors or any arrangement of other devices, such as one or more capacitors, one or more transistors, one or more inductors, or a combination thereof. Additionally, the voltage source 206 may include an NMOS transistor, rather than the current source 210. In some implementations, the voltage source 206 is also coupled to a reference point, such as ground. Further, the voltage source 206 is coupled to a second transistor circuit 212.

The second transistor circuit 212 may have a second W/L ratio that is less than the first W/L ratio. The W/L ratio of the second transistor circuit 212 may be realized by one or more NMOS transistors represented by a second NMOS transistor 214. In some instances, the W/L ratio of the second transistor circuit 212 may be realized by a number of NMOS transistors connected in series. A gate of the second NMOS transistor 214 is coupled to the voltage source 206 and a source of the second NMOS transistor 214 is coupled to ground. Further, a drain of the second NMOS transistor 214 is coupled to a source-amplifier line 216. The source-amplifier line 216 is coupled at an input of an amplifier device, such as the source-amplifier line 106 connecting the source 102 and the amplifier circuit 104 of FIG. 1.

A first gate-source voltage of the first NMOS transistor 204 is defined by the current $I_{REF}$ provided to the first NMOS transistor 204 and the current drawn from the first NMOS transistor 204 by the voltage source 206. In this way, a well-defined gate-source voltage can be produced at the first NMOS transistor 204. Additionally, this arrangement may produce other well-defined small signal parameters, such as the transconductance of the first NMOS transistor 204. A second gate-source voltage of the second NMOS transistor 214 is defined by a difference of the gate-source voltage of the first NMOS transistor 204 and a voltage drop provided by the voltage source 206. The voltage drop of the voltage source 206 may be defined by the product of the impedance value of the impedance element 208 and the current drawn by the current source 210. Thus, the second NMOS transistor 214 can have a well-defined gate-source voltage, which also results in a well-defined $R_{ON}$, that is, the impedance value that turns on the second NMOS transistor 214.

In the illustrative implementation shown in FIG. 2, the first transistor circuit 202 and the second transistor circuit 212 are placed in a current mirror type arrangement and the high impedance circuit 200 may be used to generate an impedance transformation by producing a first overdrive voltage at the first NMOS transistor 204 and a second overdrive voltage at the second NMOS transistor 214 that is different from the first overdrive voltage. In some implementations, an overdrive voltage of the first NMOS transistor 204 may be different from an overdrive voltage of the second NMOS transistor 214 due to differing gate-source voltages at the first NMOS transistor 204 and the second NMOS transistor 214, while the threshold voltages of the first NMOS transistor 204 and the second NMOS transistor 214 are approximately the same. In other implementations, the overdrive voltage of the first NMOS transistor 204 may be different from the overdrive voltage of the second NMOS transistor 214 due to differing threshold voltages of the first NMOS transistor 204 and the second NMOS transistor 214, while the gate-source voltages of the first NMOS transistor 204 and the second NMOS transistor 214 are approximately the same. In a particular example, when the overdrive voltage of the second NMOS transistor 214 is less than the overdrive voltage of the first NMOS transistor 204, the impedance value of the first NMOS transistor 204 is transformed to the impedance value of the second NMOS transistor 214 giving a very high impedance value for the high impedance circuit 200.

In some instances, the gate-source voltage of the first NMOS transistor 204, the gate-source voltage of the second NMOS transistor 214, or a combination thereof, may be in a sub-threshold region. When the gate-source voltage of the second NMOS transistor 214 is in the sub-threshold region, the impedance of the second NMOS transistor 214 may increase exponentially as the overdrive voltage of the second NMOS transistor 214 decreases. The amount of increase in the impedance of the second NMOS transistor 214 may be based on the difference in the overdrive voltages of the first NMOS transistor 204 and the second NMOS transistor 214.

In addition, when the W/L ratio of the second transistor circuit 212 is less than the W/L ratio of the first transistor circuit 202, the second transistor circuit 212 may serve as an impedance device and an impedance transformation may take place with respect to the second transistor circuit 212 that is proportional to the quotient of the W/L ratio of the first transistor circuit 202 and the W/L ratio of the second transistor circuit 212. Thus, by producing a first impedance transformation by different overdrive voltages for the NMOS transistors 204, 214, in conjunction with a second impedance transformation utilizing different W/L ratios for the transistor circuits 202, 212, the high impedance circuit 200 can provide a very high impedance for an amplifier device, such as the amplifier circuit 104 of FIG. 1. Further, although FIG. 2 shows that the gate-source voltages of the transistors 204, 214 are realized via the gates of the transistors 204, 214, the gate-source voltages may be realized via the sources of the transistors 204, 214.

Figure 3:
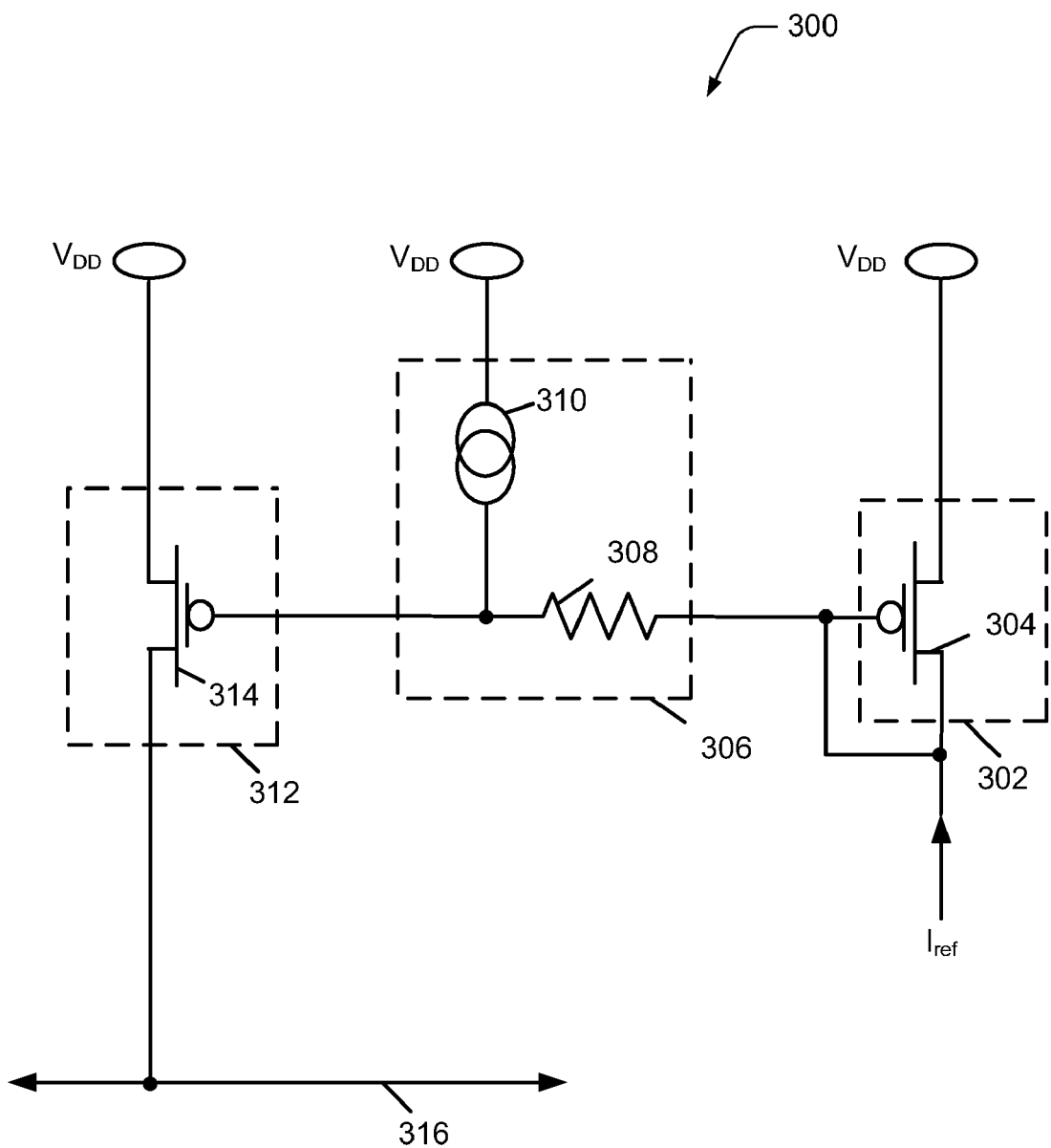
FIG. 3 is a schematic diagram of a high impedance circuit including positive channel metal oxide semiconductor (PMOS) transistor circuits coupled to a voltage source providing different overdrive voltages to each transistor circuit.

FIG. 3 is a schematic diagram of a high impedance circuit 300 including positive channel metal oxide semiconductor (PMOS) transistor circuits coupled to a voltage source providing different overdrive voltages to each transistor circuit. The high impedance circuit 300 includes a first transistor circuit 302. The first transistor circuit 302 may have a first channel width to channel length (W/L) ratio. In addition, the first transistor circuit 302 includes one or more PMOS transistors represented by a first PMOS transistor 304. Thus, the W/L ratio of the first transistor circuit 302 may be realized in a single PMOS transistor or in a number of PMOS transistors. In some instances, the W/L ratio may be realized by a number of PMOS transistors connected in parallel. A gate of the first PMOS transistor 304 is coupled to a voltage source 306 and a source of the first PMOS transistor 304 is coupled to a positive supply voltage, $V_{DD}$. A drain of the first PMOS transistor 304 receives a reference current, $I_{REF}$.

The voltage source 306 includes a number of components, such as an impedance element 308 and a current source 310. Additionally, the voltage source 306 may include an NMOS transistor, rather than the current source 310. In some implementations, the voltage source 306 is also coupled to a reference point, such as ground. Further, the voltage source 306 is coupled to a second transistor circuit 312.

The second transistor circuit 312 may have a second W/L ratio that is less than the first W/L ratio. The W/L ratio of the second transistor circuit 312 may be realized by one or more PMOS transistors represented by a second PMOS transistor 314. In some instances, the W/L ratio of the second transistor circuit 312 may be realized by a number of PMOS transistors connected in series. A gate of the second PMOS transistor 314 is coupled to the voltage source 306 and a source of the second PMOS transistor 314 is coupled to $V_{DD}$. Further, a drain of the second PMOS transistor 314 is coupled to a source-amplifier line 316. The source-amplifier line 316 is coupled at an input of an amplifier device, such as the source-amplifier line 106 connecting the source 102 and the amplifier circuit 104 of FIG. 1.

A first gate-source voltage of a first PMOS transistor 304 is defined by the current $I_{REF}$ provided to the first PMOS transistor 304 and the current drawn from the first PMOS transistor 304 by the voltage source 306. In this way, a well-defined gate-source voltage can be produced at the first PMOS transistor 304. Additionally, this arrangement may produce other well-defined small signal parameters, such as the transconductance of the first PMOS transistor 304. A second gate-source voltage of the second PMOS transistor 314 is defined by a difference of the gate-source voltage of the first PMOS transistor 304 and a voltage drop provided by the voltage source 306. The voltage drop of the voltage source 306 may be defined by the product of the impedance value of the impedance element 308 and the current drawn by the current source 310. Thus, the second PMOS transistor 314 can have a well-defined gate-source voltage, which also results in a well-defined $R_{ON}$, that is, the impedance value that turns on the second PMOS transistor 314.

In the illustrative implementation shown in FIG. 3, the first PMOS transistor 304 and the second PMOS transistor 314 are placed in a current mirror type arrangement and the high impedance circuit 300 may be used to generate an impedance transformation by producing a first overdrive voltage at the first PMOS transistor 304 and a second overdrive voltage at the second PMOS transistor 314 that is different from the first overdrive voltage. In some implementations, an overdrive voltage of the first PMOS transistor 304 may be different from an overdrive voltage of the second PMOS transistor 314 due to differing gate-source voltages at the first PMOS transistor 304 and the second PMOS transistor 314, while the threshold voltages of the first PMOS transistor 304 and the second PMOS transistor 314 are approximately the same. In other implementations, the overdrive voltage of the first PMOS transistor 304 may be different from the overdrive voltage of the second PMOS transistor 314 due to differing threshold voltages of the first PMOS transistor 304 and the second PMOS transistor 314, while the gate-source voltages of the first PMOS transistor 304 and the second PMOS transistor 314 are approximately the same. In a particular example, when the overdrive voltage of the second PMOS transistor 314 is less than the overdrive voltage of the first PMOS transistor 304, the impedance value of the first PMOS transistor 304 is transformed to the impedance value of the second PMOS transistor 314 giving a very high impedance value for the high impedance circuit 300.

In some instances, the gate-source voltage of the first PMOS transistor 304, the gate-source voltage of the second PMOS transistor 314, or a combination thereof, may be in a sub-threshold region. When the gate-source voltage of the second PMOS transistor 314 is in the sub-threshold region, the impedance of the second PMOS transistor 314 may increase exponentially as the overdrive voltage of the second PMOS transistor 314 decreases. The amount of increase in the impedance of the second PMOS transistor 314 may be based on the difference in the overdrive voltages of the first PMOS transistor 304 and the second PMOS transistor 314.

In addition, when the second W/L ratio is less than the first W/L ratio, the second transistor circuit 312 may serve as an impedance device and an impedance transformation may take place with respect to the second transistor circuit 312 that is proportional to the quotient between the first W/L ratio and the second W/L ratio. Thus, by producing a first impedance transformation by different overdrive voltages for the PMOS transistors 304, 314, in conjunction with a second impedance transformation utilizing different W/L ratios for the transistor circuits 302, 312, the high impedance circuit 300 can provide a very high impedance for an amplifier device, such as the amplifier circuit 104 of FIG. 1. In addition, although FIG. 3 shows that the gate-source voltages of the transistors 304, 314 are realized via the gates of the transistors 304, 314, the gate-source voltages may be realized via the sources of the transistors 304, 314.

Figure 4:
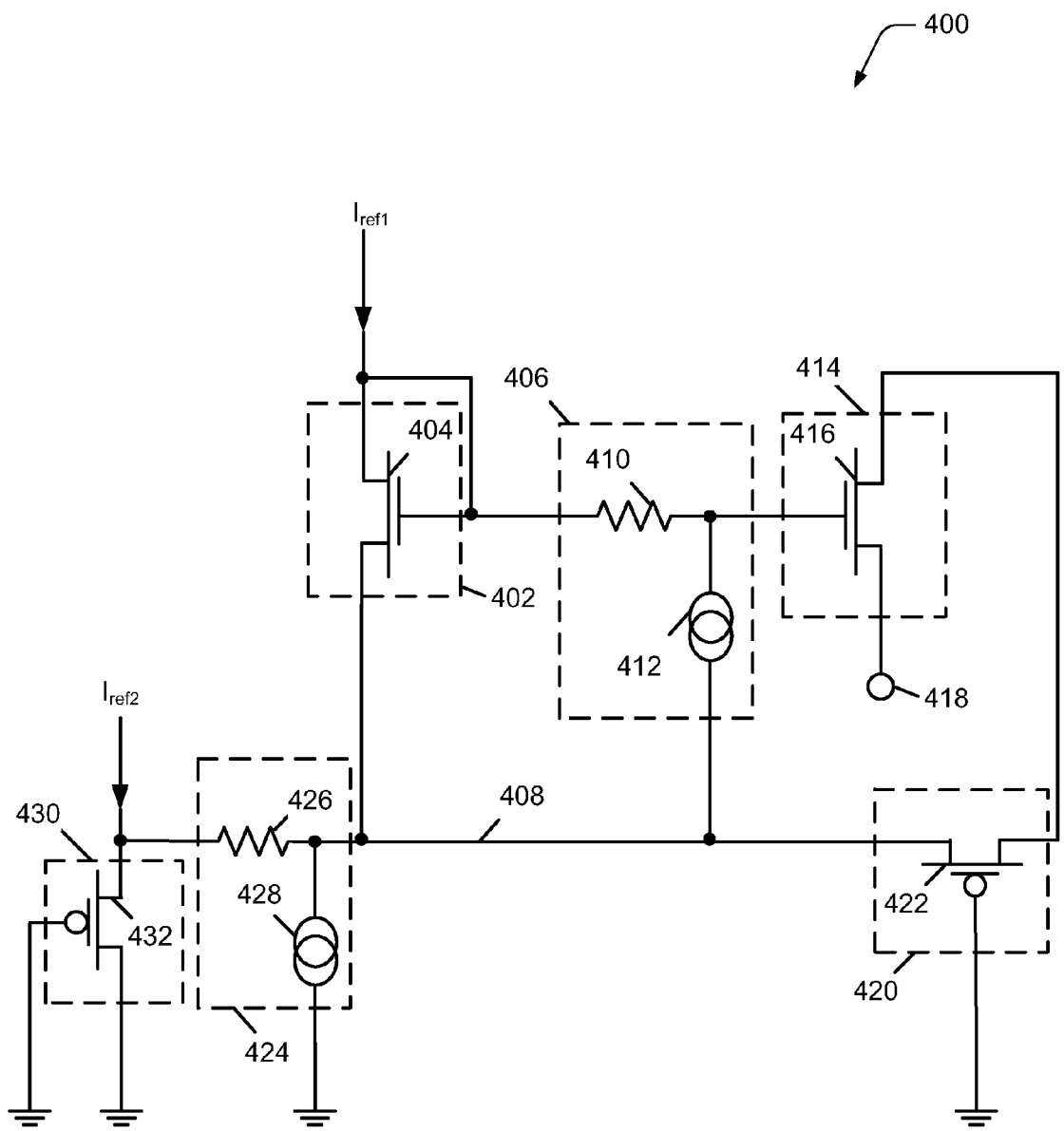
FIG. 4 is a schematic diagram of a high impedance circuit including a series connection between one NMOS transistor circuit of a pair of NMOS transistor circuits and one PMOS transistor circuit of a pair of PMOS transistor circuits, where a first voltage source provides different overdrive voltages to the NMOS transistor circuits and a second voltage source provides different overdrive voltages to the PMOS transistor circuits.

FIG. 4 is a schematic diagram of a high impedance circuit 400 including a series connection between one NMOS transistor circuit of a pair of NMOS transistor circuits and one PMOS transistor circuit of a pair of PMOS transistor circuits, where a first voltage source provides different overdrive voltages to the NMOS transistor circuits and a second voltage source provides different overdrive voltages to the PMOS transistor circuits. The high impedance circuit 400 includes a first NMOS transistor circuit 402. The first NMOS transistor circuit 402 may have a first NMOS channel width to channel length (W/L) ratio. In addition, the first NMOS transistor circuit 402 includes one or more NMOS transistors represented by a first NMOS transistor 404. Thus, the W/L ratio of the first NMOS transistor circuit 402 may be realized in a single NMOS transistor or in a number of NMOS transistors. In some instances, the first NMOS W/L ratio may be realized by a number of NMOS transistors connected in parallel. A gate of the first NMOS transistor 404 is coupled to a first voltage source 406 and a source of the first NMOS transistor 404 is coupled to a line 408. A drain of the first NMOS transistor 404 receives a reference current, $I_{REF1}$.

The first voltage source 406 includes a number of components, such as a first impedance element 410 and a first current source 412. The first voltage source 406 is also coupled to the line 408. In an alternative implementation, the first current source 412 may be coupled to ground rather than to the line 408. Additionally, the first voltage source 406 is coupled to a second NMOS transistor circuit 414. The second NMOS transistor circuit 414 may have a second NMOS W/L ratio that is less than the first NMOS W/L ratio. The W/L ratio of the second NMOS transistor circuit 414 may be realized by one or more NMOS transistors represented by a second NMOS transistor 416. In some instances, the W/L ratio of the second NMOS transistor circuit 414 may be realized by a number of NMOS transistors connected in series. A gate of the second NMOS transistor 416 is coupled to the first voltage source 406 and a source of the second NMOS transistor 416 is coupled to a connection point 418 on a source-amplifier line between a source and an amplifier device, such as the source-amplifier line 106 connecting the source 102 and the amplifier circuit 104 of FIG. 1. Further, a drain of the second NMOS transistor 416 provides a series connection to a first PMOS transistor circuit 420.

The first PMOS transistor circuit 420 may have a first PMOS channel width to channel length (W/L) ratio. In some implementations, the first PMOS W/L ratio may be different from the second NMOS W/L ratio of the second NMOS transistor circuit 414. In addition, the first PMOS transistor circuit 420 includes one or more PMOS transistors represented by a first PMOS transistor 422. Thus, the W/L ratio of the first PMOS transistor circuit 420 may be realized in a single PMOS transistor or in a number of PMOS transistors. In some instances, the first PMOS W/L ratio may be realized by a number of PMOS transistors connected in series. A source of the first PMOS transistor 422 is coupled to a second voltage source 424 and, in some implementations, a gate of the first PMOS transistor 422 is coupled to a reference point, such as ground.

The second voltage source 424 includes a number of components, such as a second impedance element 426 and a second current source 428. In some implementations, the second voltage source 424 is also coupled to a reference point, such as ground. Additionally, the second voltage source 424 is coupled to a second PMOS transistor circuit 430. The second PMOS transistor circuit 430 may have a second PMOS W/L ratio that is greater than the first PMOS W/L ratio. In some implementations, the second PMOS W/L ratio may be different from the first NMOS W/L ratio of the first NMOS transistor circuit 402. The W/L ratio of the second PMOS transistor circuit 430 may be realized by one or more PMOS transistors represented by a second PMOS transistor 432. In some instances, the W/L ratio of the second PMOS transistor circuit 430 may be realized by a number of PMOS transistors connected in parallel. A source of the second PMOS transistor 432 is coupled to the second voltage source 424. In addition, the source of the second PMOS transistor 432 receives a second reference current, $I_{REF2}$. In some implementations, a drain of the second PMOS transistor 432 and a gate of the second PMOS transistor 432 are coupled to a reference point, such as ground.

A first NMOS gate-source voltage of the first NMOS transistor 404 is defined by the current $I_{REF1}$ provided to the first NMOS transistor 404 and the current drawn from the first NMOS transistor 404 by the first voltage source 406. In this way, a well-defined gate-source voltage can be produced at the first NMOS transistor 404. Additionally, this arrangement may produce other well-defined small signal parameters, such as the transconductance of the first NMOS transistor 404. A second NMOS gate-source voltage of the second NMOS transistor 416 is defined by a difference of the gate-source voltage of the first NMOS transistor 404 and a voltage drop provided by the voltage source 406. The voltage drop of the voltage source 406 may be defined by the product of the impedance value of the impedance element 410 and the current drawn by the first current source 412. Thus, the second NMOS transistor 416 can have a well-defined gate-source voltage, which also results in a well-defined $R_{ON}$, that is, the impedance value that turns on the second NMOS transistor 416.

In the illustrative implementation shown in FIG. 4, the first NMOS transistor circuit 402 and the second NMOS transistor circuit 414 are placed in a current mirror type arrangement and the high impedance circuit 400 may be used to generate an impedance transformation by producing a first NMOS overdrive voltage at the first NMOS transistor 404 and a second NMOS overdrive voltage at the second NMOS transistor 416 that is different from the first overdrive voltage. In some implementations, the first NMOS overdrive voltage may be different from the second NMOS overdrive voltage due to differing gate-source voltages at the first NMOS transistor 404 and the second NMOS transistor 416, while the threshold voltages of the first NMOS transistor 404 and the second NMOS transistor 416 are approximately the same. In other implementations, the first NMOS overdrive voltage may be different from the second NMOS overdrive voltage due to differing threshold voltages of the first NMOS transistor 404 and the second NMOS transistor 416, while the gate-source voltages of the first NMOS transistor 404 and the second NMOS transistor 416 are approximately the same. In a particular example, when the second NMOS overdrive voltage of the second NMOS transistor 416 is less than the first NMOS overdrive voltage of the first NMOS transistor 404, the impedance value of the first NMOS transistor 404 is transformed to the impedance value of the second NMOS transistor 416 giving a very high impedance value for the high impedance circuit 400.

In some instances, the gate-source voltage of the first NMOS transistor 404, the gate-source voltage of the second NMOS transistor 416, or a combination thereof, may be in a sub-threshold region. When the gate-source voltage of the second NMOS transistor 416 is in the sub-threshold region, the impedance of the second NMOS transistor 416 may increase exponentially as the overdrive voltage of the second NMOS transistor 416 decreases. The amount of increase in the impedance of the second NMOS transistor 416 may be based on the difference in the overdrive voltages of the first NMOS transistor 404 and the second NMOS transistor 416.

In addition, when the W/L ratio of the second NMOS transistor circuit 414 is less than the W/L ratio of the first NMOS transistor circuit 402, the second NMOS transistor circuit 414 may serve as an impedance device and an impedance transformation may take place with respect to the second NMOS transistor circuit 414 that is proportional to the quotient of the W/L ratio of the first NMOS transistor circuit 402 and the W/L ratio of the second NMOS transistor circuit 414. Thus, by producing a first impedance transformation by different overdrive voltages for the NMOS transistors 404, 416, in conjunction with a second impedance transformation utilizing different W/L ratios for the transistor circuits 402, 414, the high impedance circuit 400 can provide a very high impedance for an amplifier device, such as the amplifier circuit 104 of FIG. 1.

A first PMOS gate-source voltage of the first PMOS transistor 422 is defined by a difference of the gate-source voltage of the second PMOS transistor 432 and a voltage drop provided by the second voltage source 424. The voltage drop of the second voltage source 424 may be defined by the product of the impedance value of the second impedance element 426 and the current drawn by the second current source 428. Thus, the first PMOS transistor 422 can have a well-defined gate-source voltage, which also results in a well-defined $R_{ON}$, that is, the impedance value that turns on the first PMOS transistor 422. A second PMOS gate-source voltage of the second PMOS transistor 432 is defined by the current $I_{REF2}$ provided to the second PMOS transistor 432 and the current drawn from the second PMOS transistor 432 by the second voltage source 424. In this way, a well-defined gate-source voltage can be produced at the second PMOS transistor 432. Additionally, this arrangement may produce other well-defined small signal parameters, such as the transconductance of the second PMOS transistor 432.

In the illustrative implementation shown in FIG. 4, the first PMOS transistor circuit 420 and the second PMOS transistor circuit 430 are placed in a current mirror type arrangement and the high impedance circuit 400 may be used to generate an impedance transformation by producing a first PMOS overdrive voltage at the first PMOS transistor 422 and a second PMOS overdrive voltage at the second PMOS transistor 432 that is different from the first PMOS overdrive voltage. In some implementations, the first PMOS overdrive voltage may be different from the second PMOS overdrive voltage due to differing gate-source voltages at the first PMOS transistor 422 and the second PMOS transistor 432, while the threshold voltages of the first PMOS transistor 422 and the second PMOS transistor 432 are approximately the same. In other implementations, the first PMOS overdrive voltage may be different from the second overdrive voltage due to differing threshold voltages of the first PMOS transistor 422 and the second PMOS transistor 432, while the gate-source voltages of the first PMOS transistor 422 and the second PMOS transistor 432 are approximately the same. In a particular example, when the first PMOS overdrive voltage is less than the second PMOS overdrive voltage, the impedance value of the second PMOS transistor 432 is transformed to the impedance value of the first PMOS transistor 422 giving a very high impedance value for the high impedance circuit 400.

In some instances, the gate-source voltage of the first PMOS transistor 422, the gate-source voltage of the second PMOS transistor 432, or a combination thereof, may be in a sub-threshold region. When the gate-source voltage of the first PMOS transistor 422 is in the sub-threshold region, the impedance of the first PMOS transistor 422 may increase exponentially as the overdrive voltage of the first PMOS transistor 422 decreases. The amount of increase in the impedance of the first PMOS transistor 422 may be based on the difference in the overdrive voltages of the first PMOS transistor 422 and the second PMOS transistor 432.

In addition, when the W/L ratio of the second PMOS transistor circuit 430 is greater than the W/L ratio of the first PMOS transistor circuit 420, the first PMOS transistor circuit 420 may serve as an impedance device and an impedance transformation may take place with respect to the first PMOS transistor circuit 420 that is proportional to the quotient of the W/L ratio of the second PMOS transistor circuit 430 and the W/L ratio of the first PMOS transistor circuit 420. Thus, producing a third impedance transformation utilizing different W/L ratios for the PMOS transistor circuits 420, 430, in conjunction with producing a fourth impedance transformation with different overdrive voltages for the PMOS transistors 422, 432, contributes to the impedance provided by the high impedance circuit 400 to the amplifier device.

In some instances, impedance transformations via the first NMOS transistor circuit 402 and the second NMOS transistor circuit 414 may produce non-linear behavior with respect to the impedance provided by the high impedance circuit 400 to the amplifier device. For example, the first NMOS transistor circuit 402 and the second NMOS transistor circuit 414 may be high ohmic with high voltage signals and low ohmic with low voltage signals. The impedance transformation that occurs with respect to the first PMOS transistor circuit 420 and the second PMOS transistor circuit 430 helps to offset at least some of the non-linearity in the impedance produced by the first NMOS transistor circuit 402 and the second NMOS transistor circuit 414. To illustrate, when the impedance produced by the first NMOS transistor circuit 402 and the second NMOS transistor circuit 414 is too high ohmic, then the impedance produced by the first PMOS transistor circuit 420 and the second PMOS transistor circuit 430 is low ohmic, since the impedance produced by the first PMOS transistor circuit 420 and the second PMOS transistor circuit 430 is lower with high voltage signals. In this way, the first PMOS transistor circuit 420 and the second PMOS transistor circuit 430 linearize the impedance of the high impedance circuit 400. In addition, when the impedance produced by the first NMOS transistor circuit 402 and the second NMOS transistor circuit 414 is too low ohmic, the impedance produced by the first PMOS transistor circuit 420 and the second PMOS transistor circuit 430 is high ohmic, thus at least partially linearizing the impedance of the high impedance circuit 400.

Figure 5:
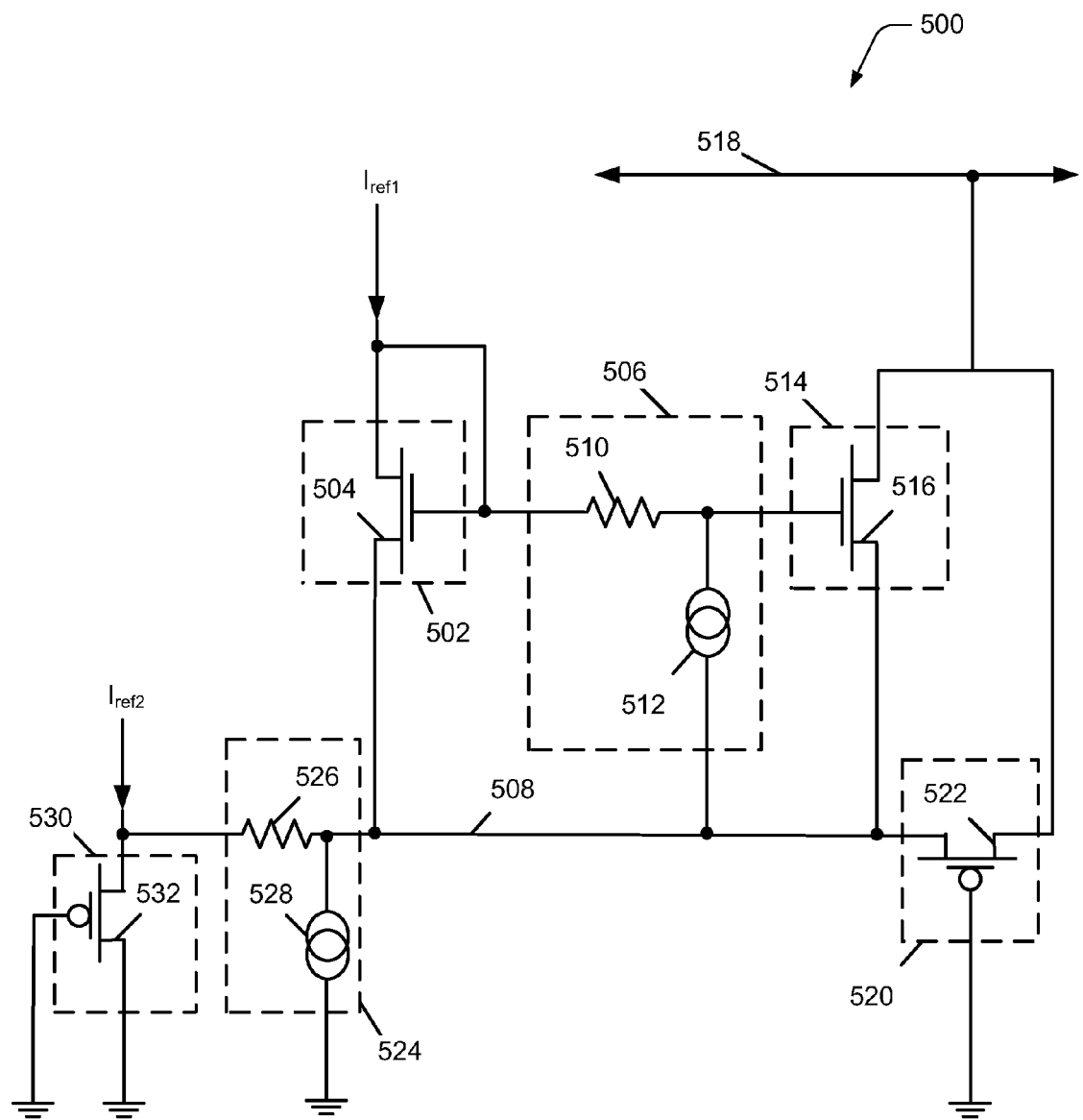
FIG. 5 is a schematic diagram of a high impedance circuit including a parallel connection between one NMOS transistor circuit of a pair of NMOS transistor circuits and one PMOS transistor circuit of a pair of PMOS transistor circuits, where a first voltage source provides different overdrive voltages to the NMOS transistor circuits and a second voltage source provides different overdrive voltages to the PMOS transistor circuits.

FIG. 5 is a schematic diagram of a high impedance circuit 500 including a parallel connection between one NMOS transistor circuit of a pair of NMOS transistor circuits and one PMOS transistor circuit of a pair of PMOS transistor circuits, where a first voltage source provides different overdrive voltages to the NMOS transistor circuits and a second voltage source provides different overdrive voltages to the PMOS transistor circuits. The high impedance circuit 500 includes a first NMOS transistor circuit 502. The first NMOS transistor circuit 502 may have a first NMOS channel width to channel length (W/L) ratio. In addition, the first NMOS transistor circuit 502 includes one or more NMOS transistors represented by a first NMOS transistor 504. Thus, the W/L ratio of the first NMOS transistor circuit 502 may be realized in a single NMOS transistor or in a number of NMOS transistors. In some instances, the first NMOS W/L ratio may be realized by a number of NMOS transistors connected in parallel. A gate of the first NMOS transistor 504 is coupled to a first voltage source 506 and a source of the first NMOS transistor 504 is coupled to a line 508. A drain of the first NMOS transistor 504 receives a reference current, $I_{REF1}$.

The first voltage source 506 includes a number of components, such as a first impedance element 510 and a first current source 512. The first voltage source 506 is also coupled to the line 508. In an alternative implementation, the first current source 512 may be coupled to ground rather than to the line 508. Additionally, the first voltage source 506 is coupled to a second NMOS transistor circuit 514. The second NMOS transistor circuit 514 may have a second NMOS W/L ratio that is less than the first NMOS W/L ratio. The W/L ratio of the second NMOS transistor circuit 514 may be realized by one or more NMOS transistors represented by a second NMOS transistor 516. In some instances, the W/L ratio of the second NMOS transistor circuit 514 may be realized by a number of NMOS transistors connected in series. A gate of the second NMOS transistor 516 is coupled to the first voltage source 506 and a drain of the second NMOS transistor 516 is coupled to a source-amplifier line 518 between a source and an amplifier device, such as the source-amplifier line 106 connecting the source 102 and the amplifier circuit 104 of FIG. 1. Additionally, the drain of the second NMOS transistor 516 is coupled to a first PMOS transistor circuit 520 and a source of the second NMOS transistor 516 is coupled to the line 508, thus providing a parallel connection between the second NMOS transistor circuit 514 and the first PMOS transistor circuit 520. In some implementations, the parallel connection between the second NMOS transistor circuit 514 and the first PMOS transistor circuit 520 may produce a clamping effect.

The first PMOS transistor circuit 520 may have a first PMOS channel width to channel length (W/L) ratio. In some implementations, the first PMOS W/L ratio may be different from the second NMOS W/L ratio of the second NMOS transistor circuit 514. In addition, the first PMOS transistor circuit 520 includes one or more PMOS transistors represented by a first PMOS transistor 522. Thus, the W/L ratio of the first PMOS transistor circuit 520 may be realized in a single PMOS transistor or in a number of PMOS transistors. In some instances, the first PMOS W/L ratio may be realized by a number of PMOS transistors connected in series. A source of the first PMOS transistor 522 is coupled to a second voltage source 524. In some implementations, a gate of the first PMOS transistor 522 is coupled to a reference, point, such as ground.

The second voltage source 524 includes a number of components, such as a second impedance element 526 and a second current source 528. In some implementations, the second voltage source 524 is also coupled to a reference point, such as ground. Additionally, the second voltage source 524 is coupled to a second PMOS transistor circuit 530. The second PMOS transistor circuit 530 may have a second PMOS W/L ratio that is greater than the first PMOS W/L ratio. The W/L ratio of the second PMOS transistor circuit 530 may be realized by one or more PMOS transistors represented by a second PMOS transistor 532. In some instances, the W/L ratio of the second transistor circuit 530 may be realized by a number of PMOS transistors connected in parallel. A source of the second PMOS transistor 532 is coupled to the second voltage source 524. In addition, the source of the second PMOS transistor 532 receives a second reference current, $I_{REF2}$. In some implementations, a drain of the second PMOS transistor 532 and a gate of the second PMOS transistor 532 are also coupled to ground. In some implementations, the second PMOS W/L ratio may be different from the first NMOS W/L ratio of the first NMOS transistor circuit 502.

A first NMOS gate-source voltage of the first NMOS transistor 504 is defined by the current $I_{REF1}$ provided to the first NMOS transistor 504 and the current drawn from the first NMOS transistor 504 by the first voltage source 506. In this way, a well-defined gate-source voltage can be produced at the first NMOS transistor 504. Additionally, this arrangement may produce other well-defined small signal parameters, such as the transconductance of the first NMOS transistor 504. A second NMOS gate-source voltage of the second NMOS transistor 516 is defined by a difference of the gate-source voltage of the first NMOS transistor 504 and a voltage drop provided by the first voltage source 506. The voltage drop of the first voltage source 506 may be defined by the product of the impedance value of the impedance element 510 and the current drawn by the first current source 512. Thus, the second NMOS transistor 516 can have a well-defined gate-source voltage, which also results in a well-defined $R_{ON}$, that is, the impedance value that turns on the second NMOS transistor 516.

In the illustrative implementation shown in FIG. 5, the first NMOS transistor circuit 502 and the second NMOS transistor circuit 514 are placed in a current mirror type arrangement and the high impedance circuit 500 may be used to generate an impedance transformation by producing a first NMOS overdrive voltage at the first NMOS transistor 504 and a second NMOS overdrive voltage at the second NMOS transistor 516. In some implementations, the first NMOS overdrive voltage may be different from the second NMOS overdrive voltage due to differing gate-source voltages at the first NMOS transistor 504 and the second NMOS transistor 516, while the threshold voltages of the first NMOS transistor 504 and the second NMOS transistor 516 are approximately the same. In other implementations, the first NMOS overdrive voltage may be different from the second NMOS overdrive voltage due to differing threshold voltages of the first NMOS transistor 504 and the second NMOS transistor 516, while the gate-source voltages of the first NMOS transistor 504 and the second NMOS transistor 516 are approximately the same. In a particular example, when the second NMOS overdrive voltage is less than the first NMOS overdrive voltage, the impedance value of the first NMOS transistor 504 is transformed to the impedance value of the second NMOS transistor 516 giving a very high impedance value for the high impedance circuit 500.

In some instances, the gate-source voltage of the first NMOS transistor 504, the gate-source voltage of the second NMOS transistor 516, or a combination thereof, may be in a sub-threshold region. When the gate-source voltage of the second NMOS transistor 516 is in the sub-threshold region, the impedance of the second NMOS transistor 516 may increase exponentially as the overdrive voltage of the second NMOS transistor 516 decreases. The amount of increase in the impedance of the second NMOS transistor 516 may be based on the difference in the overdrive voltages of the first NMOS transistor 504 and the second NMOS transistor 516.

When the NMOS W/L ratio of the second NMOS transistor circuit 514 is less than the NMOS W/L ratio of the first NMOS transistor circuit 502, the second NMOS transistor circuit 514 may serve as an impedance device and an impedance transformation may take place with respect to the second NMOS transistor circuit 514 that is proportional to the quotient of the NMOS W/L ratio of the first NMOS transistor circuit 502 and the NMOS W/L ratio of the second transistor circuit 514. Thus, by producing a first impedance transformation utilizing different W/L ratios for the NMOS transistor circuits 502, 514, in conjunction with producing a second impedance transformation with different overdrive voltages for the NMOS transistors 504, 516, the high impedance circuit 500 can provide a very high input impedance for an amplifier device, such as the amplifier circuit 104 of FIG. 1.

A first PMOS gate-source voltage of the first PMOS transistor 522 is defined by a difference of the gate-source voltage of the second PMOS transistor 532 and a voltage drop provided by the second voltage source 524. The voltage drop of the second voltage source 524 may be defined by the product of the impedance value of the second impedance element 526 and the current drawn by the second current source 528. Thus, the first PMOS transistor 522 can have a well-defined gate-source voltage, which also results in a well-defined $R_{ON}$, that is, the impedance value that turns on the first PMOS transistor 522. A second PMOS gate-source voltage of the second PMOS transistor 532 is defined by the current $I_{REF2}$ provided to the second PMOS transistor 532 and the current drawn from the second PMOS transistor 532 by the second voltage source 524. In this way, a well-defined gate-source voltage can be produced at the second PMOS transistor 532. Additionally, this arrangement may produce other well-defined small signal parameters, such as the transconductance of the second PMOS transistor 532.

In the illustrative implementation shown in FIG. 5, the first PMOS transistor circuit 520 and the second PMOS transistor circuit 530 are placed in a current mirror type arrangement and the high impedance circuit 500 may be used to generate an impedance transformation by producing a first PMOS overdrive voltage at the first PMOS transistor 522 and a second PMOS overdrive voltage at the second PMOS transistor 532. In some implementations, the first PMOS overdrive voltage may be different from the second PMOS overdrive voltage due to differing gate-source voltages at the first PMOS transistor 522 and the second PMOS transistor 532, while the threshold voltages of the first PMOS transistor 522 and the second PMOS transistor 532 are approximately the same. In other implementations, the first PMOS overdrive voltage may be different from the second PMOS overdrive voltage due to differing threshold voltages of the first PMOS transistor 522 and the second PMOS transistor 532, while the gate-source voltages of the first PMOS transistor 522 and the second PMOS transistor 532 are approximately the same. In a particular example, when the first PMOS overdrive voltage is less than the second PMOS overdrive voltage, the impedance value of the second PMOS transistor 532 is transformed to the impedance value of the first PMOS transistor 522 giving a very high impedance value for the high impedance circuit 500.

In some instances, the gate-source voltage of the first PMOS transistor 522, the gate-source voltage of the second PMOS transistor 532, or a combination thereof, may be in a sub-threshold region. When the gate-source voltage of the first PMOS transistor 522 is in the sub-threshold region, the impedance of the first PMOS transistor 522 may increase exponentially as the overdrive voltage of the first PMOS transistor 522 decreases. The amount of increase in the impedance of the first PMOS transistor 522 may be based on the difference in the overdrive voltages of the first PMOS transistor 522 and the second PMOS transistor 532.

When the W/L ratio of the second PMOS transistor circuit 530 is greater than the W/L ratio of the first transistor circuit 520, the first PMOS transistor circuit 520 may serve as an impedance device and an impedance transformation may take place with respect to the first PMOS transistor circuit 520 that is proportional to the quotient of the W/L ratio of the first PMOS transistor circuit 520 and the W/L ratio of the second PMOS transistor circuit 530. Thus, by producing a third impedance transformation utilizing different W/L ratios for the first PMOS transistor circuit 520 and the second PMOS transistor circuit 530, in conjunction with producing a fourth impedance transformation with different overdrive voltages for the PMOS transistors 522, 532, contributes to the impedance provided by the high impedance circuit 500 to the amplifier device.

In some instances, impedance transformations via the first NMOS transistor circuit 502 and the second NMOS transistor circuit 514 may produce non-linear behavior with respect to the impedance provided by the high impedance circuit 500.

The impedance transformations that occur with respect to the first PMOS transistor circuit 520 and the second PMOS transistor circuit 530 helps to offset at least some of the non-linearity in the impedance produced by the first NMOS transistor circuit 502 and the second NMOS transistor circuit 514.

Figure 6:
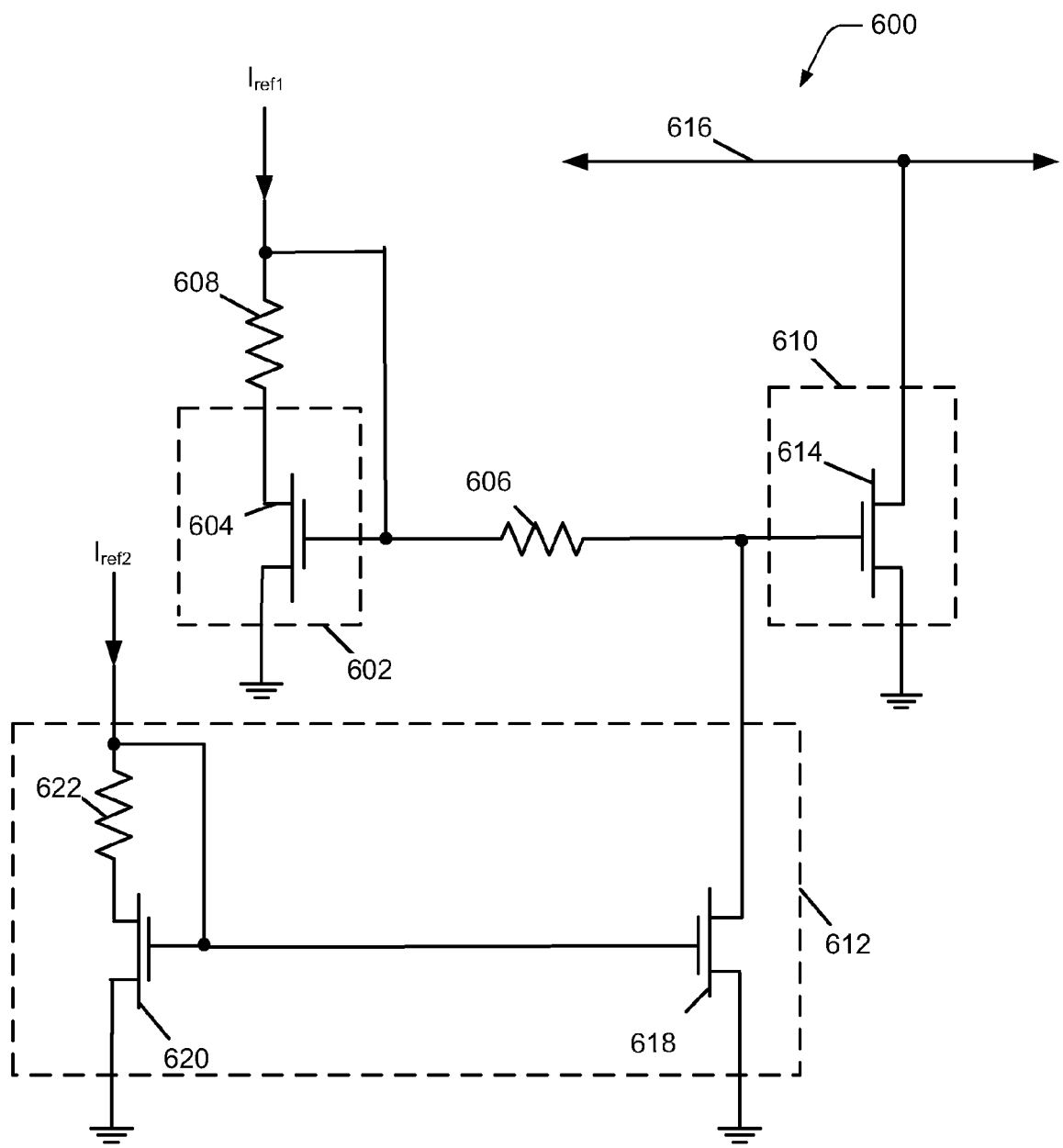
FIG. 6 is a schematic diagram of a high impedance circuit including NMOS transistor circuits coupled to an impedance element and a current source to provide different overdrive voltages to the NMOS transistor circuits.

FIG. 6 is a schematic diagram of a high impedance circuit 600 including NMOS transistor arrangements coupled to an impedance element and a current source to provide different overdrive voltages to the NMOS transistor arrangements. The high impedance circuit 600 includes a first transistor circuit 602. The first transistor circuit 602 may have a first channel width to channel length (W/L) ratio. In addition, the first transistor circuit 602 includes one or more NMOS transistors represented by a first NMOS transistor 604. Thus, the W/L ratio of the first transistor circuit 602 may be realized in a single NMOS transistor or in a number of NMOS transistors. In some instances, the W/L ratio may be realized by a number of NMOS transistors connected in parallel. A gate of the first NMOS transistor 604 is coupled to a first impedance element 606 and a source of the first NMOS transistor 604 is coupled to ground. A drain of the first NMOS transistor 604 is coupled to a second impedance element 608. The second impedance element 608 receives a reference current, $I_{REF1}$.

The first impedance element 606 is coupled to a second transistor circuit 610 and a current source 612. The second transistor circuit 610 may have a second W/L ratio that is less than the first W/L ratio. The W/L ratio of the second transistor circuit 610 may be realized by one or more NMOS transistors represented by a second NMOS transistor 614. In some instances, the W/L ratio of the second transistor circuit 610 may be realized by a number of NMOS transistors connected in series. A gate of the second NMOS transistor 614 is coupled to the first impedance element 606 and to the current source 612. In some implementations, a source of the second NMOS transistor 614 is coupled to a reference point, such as ground. Further, a drain of the second NMOS transistor 614 is coupled to a source-amplifier line 616. The source-amplifier line 616 is coupled between a source and an amplifier device, such as the source-amplifier line 106 connecting the source 102 and the amplifier circuit 104 of FIG. 1.

The current source 612 includes a third NMOS transistor 618 in a current mirror arrangement with a fourth NMOS transistor 620. A drain of the third NMOS transistor 618 is coupled to the first impedance element 606 and the second transistor circuit 610. In some implementations, a source of the third NMOS transistor 618 is coupled to a reference point, such as ground. In addition, a gate of the third NMOS transistor 618 is coupled to a gate of the fourth NMOS transistor 620. A source of the fourth NMOS transistor 620 may be coupled to ground and a drain of the fourth NMOS transistor 620 is coupled to a third impedance element 622. The third impedance element 622 receives a reference current, $I_{REF2}$.

A first NMOS gate-source voltage of the first NMOS transistor 604 is defined by the current $I_{REF1}$ provided to the first NMOS transistor 604 and the current drawn from the first NMOS transistor 604 by the current source 612. In this way, a well-defined gate-source voltage can be produced at the first NMOS transistor 604. A second NMOS gate-source voltage of the second NMOS transistor 614 is defined by a difference of the gate-source voltage of the first NMOS transistor 604 and a voltage drop defined by the product of the impedance value of the impedance element 606 and the current drawn by the current source 612. Thus, the second NMOS transistor 614 can have a well-defined gate-source voltage, which also results in a well-defined $R_{ON}$, that is, the impedance value that turns on the second NMOS transistor 614.

In the illustrative implementation shown in FIG. 6, the first transistor circuit 602 and the second transistor circuit 610 are placed in a current mirror type arrangement and the high impedance circuit 600 may be used to generate an impedance transformation by producing a first overdrive voltage at the first NMOS transistor 604 and a second overdrive voltage at the second NMOS transistor 614 that is different from the first overdrive voltage. In some implementations, an overdrive voltage of the first NMOS transistor 604 may be different from an overdrive voltage of the second NMOS transistor 614 due to differing gate-source voltages at the first NMOS transistor 604 and the second NMOS transistor 614, while the threshold voltages of the first NMOS transistor 604 and the second NMOS transistor 614 are approximately the same. In other implementations, the overdrive voltage of the first NMOS transistor 604 may be different from the overdrive voltage of the second NMOS transistor 614 due to differing threshold voltages of the first NMOS transistor 604 and the second NMOS transistor 614, while the gate-source voltages of the first NMOS transistor 604 and the second NMOS transistor 614 are approximately the same. In a particular example, when the overdrive voltage of the second NMOS transistor 614 is less than the overdrive voltage of the first NMOS transistor 604, the impedance value of the first NMOS transistor 604 is transformed to the impedance value of the second NMOS transistor 614 giving a very high impedance value for the high impedance circuit 600.

In some instances, the gate-source voltage of the first NMOS transistor 604, the gate-source voltage of the second NMOS transistor 614, or a combination thereof, may be in a sub-threshold region. When the gate-source voltage of the second NMOS transistor 614 is in the sub-threshold region, the impedance of the second transistor circuit 610 may increase exponentially as the overdrive voltage of the second NMOS transistor 614 decreases. The amount of increase in the impedance of the second NMOS transistor 614 may be based on the difference in the overdrive voltages of the first NMOS transistor 604 and the second NMOS transistor 614.

When the W/L ratio of the second transistor circuit 610 is less than the W/L ratio of the first transistor circuit 602, the second transistor circuit 610 may serve as an impedance device and an impedance transformation may take place with respect to the second transistor circuit 610 that is proportional to the quotient of the first W/L ratio and the second W/L ratio. Thus, by producing a first impedance transformation by different overdrive voltages for the NMOS transistors 604, 614, in conjunction with a second impedance transformation utilizing different W/L ratios for the transistor circuits 602, 610, the high impedance circuit 600 can provide a very high impedance for an amplifier device, such as the amplifier circuit 104 of FIG. 1.

In addition, in some instances, the current source 612 may depart from ideal behavior due to second-order effects, such as the Early effect. To offset the second-order effects with respect to the current source 612, the drain source voltages of the first NMOS transistor 604, the third NMOS transistor 618, and the fourth NMOS transistor 620 may be approximately the same. In this way, the current produced by the current source 612 can be relatively stable and well-defined. In some implementations, the current source 612 may be used as the current source 210 of FIG. 2, the first current source 412 and the second current source 428 of FIG. 4, and the first current source 512 and the second current source 528 of FIG. 5. A current source similar to that of the current source 612 using PMOS transistors connected to $V_{DD}$ rather than ground may be used as the current source 310 of FIG. 3. Further, an additional impedance element, such as the second impedance element 608, may be coupled to the drain of the first NMOS transistor 204 of FIG. 2, a drain of the first PMOS transistor 304 of FIG. 3, a drain of the first NMOS transistor 404 of FIG. 4, and a drain of the first NMOS transistor 504 of FIG. 5.

Figure 7:
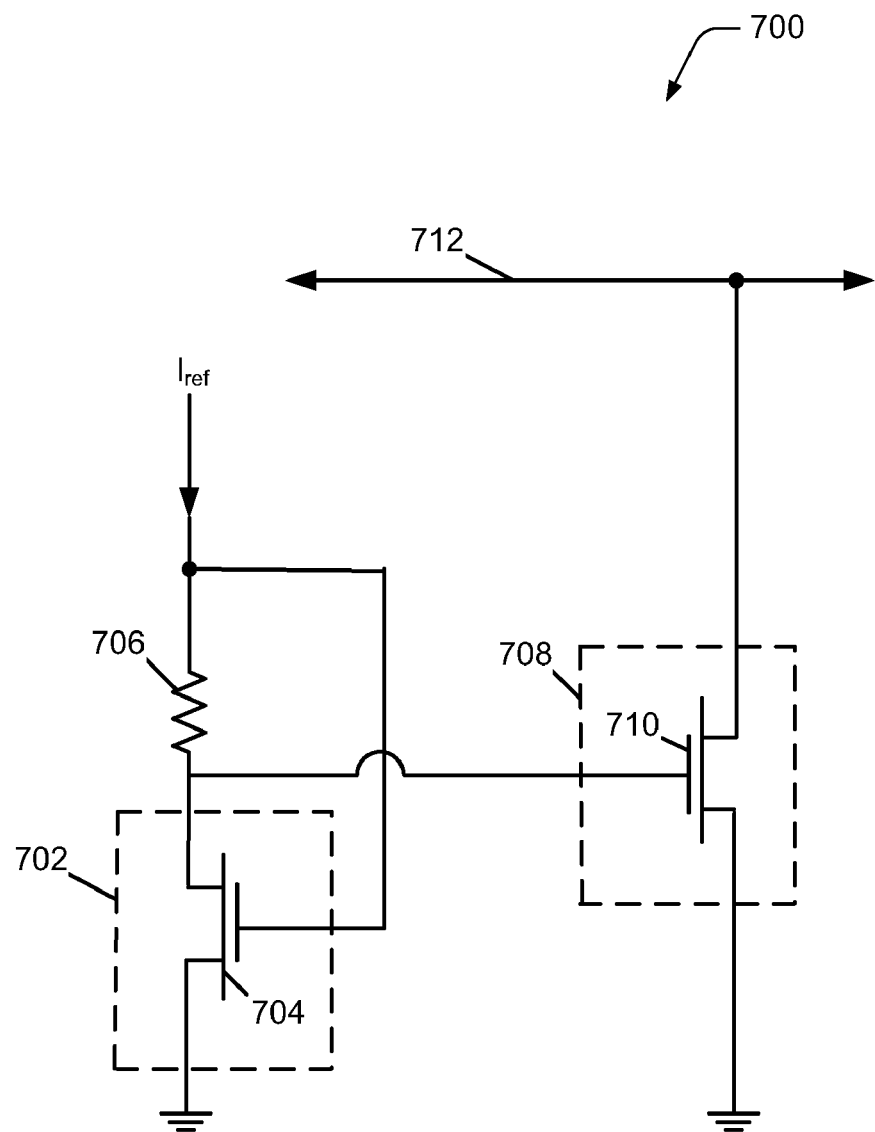
FIG. 7 is a schematic diagram of a high impedance circuit including a gate to drain coupling of NMOS transistor circuits having different overdrive voltages.

FIG. 7 is a schematic diagram of a high impedance circuit 700 including a gate to drain coupling of NMOS transistor circuits having different overdrive voltages. The high impedance circuit 700 includes a first transistor circuit 702. The first transistor circuit 702 may have a first channel width to channel length (W/L) ratio. In addition, the first transistor circuit 702 includes one or more NMOS transistors represented by a first NMOS transistor 704. Thus, the W/L ratio of the first transistor circuit 702 may be realized in a single NMOS transistor or in a number of NMOS transistors. In some instances, the W/L ratio may be realized by a number of NMOS transistors connected in parallel. A source of the first NMOS transistor 704 may be coupled to ground and a drain of the first NMOS transistor 704 is coupled to an impedance element 706. The impedance element 706 receives a reference current, $I_{REF}$. Further, a gate of the first NMOS transistor 704 also receives the reference current, $I_{REF}$.

The high impedance circuit 700 also includes a second transistor circuit 708. In the illustrative implementation shown in FIG. 7, the first transistor circuit 702 and the second transistor circuit 708 are placed in a current mirror type arrangement. The second transistor circuit 708 may have a second W/L ratio that is less than the first W/L ratio. The W/L ratio of the second transistor circuit 708 may be realized by one or more NMOS transistors represented by a second NMOS transistor 710. In some instances, the W/L ratio of the second transistor circuit 708 may be realized by a number of NMOS transistors connected in series. A gate of the second NMOS transistor 710 is coupled to the drain of the first NMOS transistor 704 and a source of the second NMOS transistor 710 may be coupled to ground. Further, a drain of the second NMOS transistor 710 is coupled to a source-amplifier line 712. The source-amplifier line 712 is coupled between a source and an amplifier device, such as the source-amplifier line 106 connecting the source 102 and the amplifier circuit 104 of FIG. 1.

A gate source voltage of the first NMOS transistor 704 is defined by the current, $I_{REF}$, and the gate-source voltage of the second NMOS transistor 710 is defined by a difference of the gate-source voltage of the first NMOS transistor 704 and a voltage defined by the product of the impedance value of the impedance element 706 and the value of the current $I_{REF}$. In some implementations, the gate-source voltage of the first NMOS transistor 704 may be in the sub-threshold region, the gate-source voltage of the second NMOS transistor 710 may be in the sub-threshold region, or a combination thereof.

An impedance transformation may occur by producing different overdrive voltages of the first NMOS transistor 704 and the second NMOS transistor 710. In some implementations, an overdrive voltage of the first NMOS transistor 704 may be different from an overdrive voltage of the second NMOS transistor 710 due to differing gate-source voltages at the first NMOS transistor 704 and the second NMOS transistor 710, while the threshold voltages of the first NMOS transistor 704 and the second NMOS transistor 710 are approximately the same. In these implementations, the difference between the gate-source voltage of the first NMOS transistor 704 and the gate-source voltage of the second NMOS transistor 710 is due to the impedance element 706 coupled to the drain of the second NMOS transistor 710. In other implementations, the overdrive voltage of the first NMOS transistor 704 may be different from the overdrive voltage of the second NMOS transistor 710 due to differing threshold voltages of the first NMOS transistor 704 and the second NMOS transistor 710, while the gate-source voltages of the first NMOS transistor 704 and the second NMOS transistor are approximately the same. In a particular example, when the overdrive voltage of the second NMOS transistor 710 is less than the overdrive voltage of the first NMOS transistor 704, the impedance value of the first NMOS transistor 704 is transformed to the impedance value of the second NMOS transistor 710 giving a very high impedance value for the high impedance circuit 700. When the gate-source voltage of the second NMOS transistor 710 is in the sub-threshold region, the impedance of the second NMOS transistor 710 may increase exponentially as the overdrive voltage of the second NMOS transistor 710 decreases. The amount of increase in the impedance of the second NMOS transistor 710 may be based on the difference in the overdrive voltages of the first NMOS transistor 704 and the second NMOS transistor 710.

Further, when the W/L ratio of the second transistor circuit 708 is less than the W/L ratio of the first transistor circuit 702, the second transistor circuit 708 may serve as an impedance device and an impedance transformation may take place with respect to the second transistor circuit 708 that is proportional to the quotient of the W/L ratio of the first transistor circuit 702 and the W/L ratio of the second transistor circuit 708. Thus, by producing an impedance transformation due to differing overdrive voltages of the first NMOS transistor 704 and the second NMOS transistor 710 and by producing an impedance transformation due to differing W/L ratios of the first transistor circuit 702 and the second transistor circuit 708, the high impedance circuit 700 can provide very high input impedance for an amplifier device, such as the amplifier circuit 104 of FIG. 1.

Figure 8:
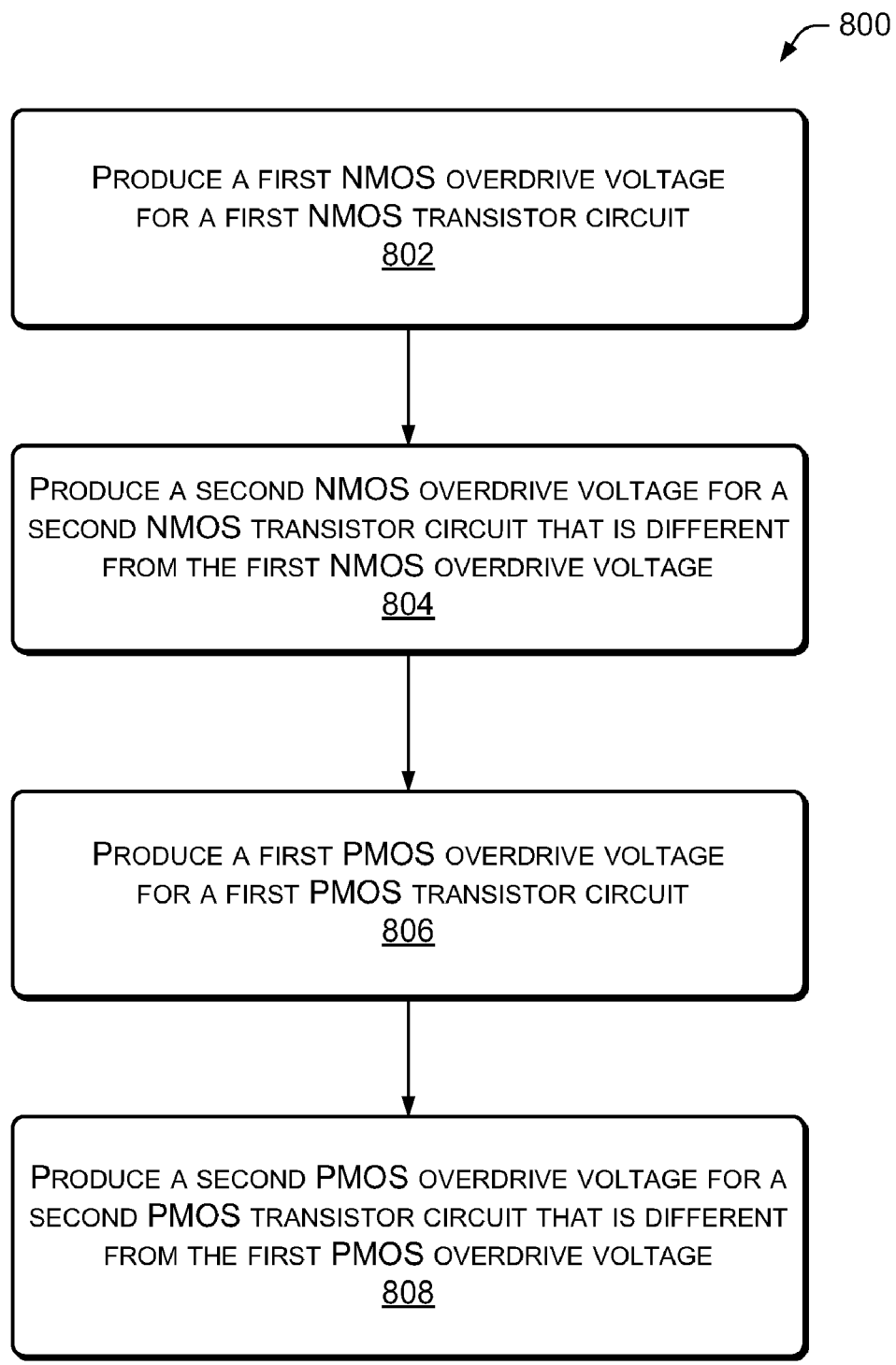
FIG. 8 is a flow diagram of a method of producing impedance transformations with transistor circuits.

FIG. 8 is a flow diagram of a method 800 of producing impedance transformations in a high impedance circuit, such as the high impedance circuits 110, 200, 300, 400, 500, 600, and 700 of FIGS. 1-7, respectively.

Specifics of exemplary methods are described below. However, it should be understood that certain acts need not be performed in the order described, and may be modified, and/or may be omitted entirely, depending on the circumstances. Moreover, the acts described may be implemented by a computer, processor or other computing device based on instructions stored on one or more computer-readable storage media. The computer-readable storage media can be any available media that can be accessed by a computing device to implement the instructions stored thereon.

At 802, a first NMOS overdrive voltage is produced for a first NMOS transistor circuit. The first NMOS overdrive voltage is defined by the value of the threshold voltage of the first NMOS transistor circuit subtracted from the gate-source voltage of the first NMOS transistor circuit. The gate-source voltage of the first NMOS transistor circuit may by produced by applying a first bias current to the first NMOS transistor circuit. The gate-source voltage of the first NMOS transistor may also be in the sub-threshold region of the first NMOS transistor circuit. In addition, the first NMOS transistor circuit may have a first NMOS W/L ratio that is realized by a number of NMOS transistors coupled in parallel.

At 804, a second NMOS overdrive voltage is produced for a second NMOS transistor circuit that is different from the first NMOS overdrive voltage. The second NMOS overdrive voltage is defined by the value of the threshold voltage of the second NMOS transistor circuit subtracted from the gate-source voltage of the second NMOS transistor circuit. The gate-source voltage of the second NMOS transistor circuit may be defined by modifying the gate-source voltage of the first NMOS transistor circuit using a first voltage source. The gate-source voltage of the second NMOS transistor circuit may also be in the sub-threshold region of the second NMOS transistor circuit. In addition, the second NMOS transistor circuit may have a second NMOS W/L ratio that is realized by a number of NMOS transistors coupled in series. In some implementations, the second NMOS overdrive voltage is less than the first NMOS overdrive voltage. In this way, the second NMOS transistor circuit acts as an impedance device and an impedance transformation takes place due to the differing overdrive voltages. An additional impedance transformation may also take place due to the differing W/L ratios of the first NMOS transistor circuit and the second NMOS transistor circuit.

At 806, a first PMOS overdrive voltage is produced for a first PMOS transistor circuit. The first PMOS overdrive voltage is defined by the value of the threshold voltage of the first PMOS transistor circuit subtracted from the gate-source voltage of the first PMOS transistor circuit. The gate-source voltage of the first PMOS transistor circuit may by produced by applying a second bias current to the first PMOS transistor circuit. The gate-source voltage of the first PMOS transistor circuit may also be in the sub-threshold region of the first PMOS transistor circuit. In addition, the first PMOS transistor circuit may have a first PMOS W/L ratio that is realized by a number of PMOS transistors coupled in parallel.

At 808, a second PMOS overdrive voltage is produced for a second PMOS transistor circuit that is different from the first PMOS overdrive voltage. The second PMOS overdrive voltage is defined by the value of the threshold voltage of the second PMOS transistor circuit subtracted from the gate-source voltage of the second PMOS transistor circuit. The gate-source voltage of the second PMOS transistor circuit may be defined by modifying the gate-source voltage of the first PMOS transistor circuit using a second voltage source. The gate-source voltage of the second PMOS transistor circuit may also be in the sub-threshold region of the second PMOS transistor circuit. In addition, the second PMOS transistor circuit may have a second PMOS W/L ratio that is realized by a number of PMOS transistors coupled in series. Further, the second PMOS transistor circuit may be coupled in series or parallel with the second NMOS transistor circuit. In some implementations, the second PMOS overdrive voltage is less than the first PMOS overdrive voltage. In this way, the second PMOS transistor circuit acts as an impedance device and an impedance transformation takes place due to the differing overdrive voltages. An additional impedance transformation may also take place due to differing W/L ratios of the first PMOS transistor circuit and the second PMOS transistor circuit. Further, by producing impedance transformations utilizing a pair of NMOS transistor circuits and producing impedance transformations utilizing a pair of PMOS transistor circuits in a high impedance circuit, non-linear behavior of the high impedance circuit may be reduced.

CONCLUSION

For the purposes of this disclosure and the claims that follow, the terms "coupled" and "connected" have been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims. The specific features and acts described in this disclosure and variations of these specific features and acts may be implemented separately or may be combined.

The invention claimed is:

1. An apparatus comprising:
   a first transistor circuit having a first overdrive voltage, wherein the first overdrive voltage is defined by a gate-source voltage of the first transistor circuit minus a threshold voltage of the first transistor circuit; and
   a second transistor circuit having a second overdrive voltage, wherein the second overdrive voltage is defined by a gate-source voltage of the second transistor circuit minus a threshold voltage of the second transistor circuit, and wherein the second transistor circuit is placed in a current mirror type arrangement with the first transistor circuit,
   wherein an impedance of the second transistor circuit increases as the second overdrive voltage decreases with respect to the first overdrive voltage and wherein the threshold voltage of the second transistor circuit is higher than the threshold voltage of the first transistor circuit and the gate-source voltage of the second transistor circuit is approximately equal to the qate-source voltage of the first transistor circuit.

2. The apparatus of claim 1, wherein the first transistor circuit has a first channel width to channel length ratio and the second transistor circuit has a second channel width to channel length ratio that is smaller than the first channel width to channel length ratio.

3. The apparatus of claim 1, wherein the first gate-source voltage, the second gate-source voltage, or a combination thereof, are in a sub-threshold region.

4. The apparatus of claim 1, further comprising a voltage source coupled to the first transistor circuit and the second transistor circuit, wherein the voltage source includes a first impedance element and a current source.

5. The apparatus of claim 4, wherein a gate of the first transistor circuit is coupled to the first impedance element and a gate of the second transistor circuit is coupled to the first impedance element.

6. The apparatus of claim 4, wherein the current source comprises a current mirror arrangement including a first NMOS transistor and a second NMOS transistor.

7. The apparatus of claim 1, wherein the first transistor circuit includes a plurality of transistors connected in parallel.

8. The apparatus of claim 1, wherein the second transistor circuit includes a plurality of transistors connected in series.

9. An apparatus comprising:
   a first negative channel metal oxide semiconductor (NMOS) transistor circuit having a first channel width to channel length ratio;
   a second NMOS transistor circuit having a second channel width to channel length ratio, wherein a gate of the second NMOS transistor circuit is coupled to a drain of the first NMOS transistor circuit, and wherein the second channel width to channel length ratio is less than the first channel width to channel length ratio; and
   an impedance element coupled to the drain of the first NMOS transistor circuit,
   wherein a drain of the second NMOS transistor circuit is coupled to a source-amplifier line connecting a source and an amplifier circuit.

* * * * *